United States Patent
Mizuyoshi

(10) Patent No.: US 7,537,368 B2
(45) Date of Patent: May 26, 2009

(54) SURFACE LIGHT-SOURCE DEVICE USING LIGHT-EMITTING ELEMENTS

(75) Inventor: Akira Mizuyoshi, Asaka (JP)

(73) Assignee: FUJIFILM Corporation, Tokyo (JP)

( * ) Notice: Subject to any disclaimer, the term of this patent is extended or adjusted under 35 U.S.C. 154(b) by 225 days.

(21) Appl. No.: 11/606,050

(22) Filed: Nov. 30, 2006

(65) Prior Publication Data

US 2007/0120109 A1 May 31, 2007

(30) Foreign Application Priority Data

Nov. 30, 2005 (JP) ............................. 2005-346600

(51) Int. Cl.
*F21V 7/00* (2006.01)
*H01L 33/00* (2006.01)

(52) U.S. Cl. ..................... 362/600; 362/338; 362/613; 362/614; 257/88; 257/89; 257/98; 257/E33.059; 257/E33.072

(58) Field of Classification Search ................... 257/88, 257/89; 362/600, 613, 614
See application file for complete search history.

(56) References Cited

U.S. PATENT DOCUMENTS

2004/0119668 A1* 6/2004 Homma et al. ................. 345/82

FOREIGN PATENT DOCUMENTS

JP 2005-234397 A 9/2005

* cited by examiner

*Primary Examiner*—Dao H Nguyen
(74) *Attorney, Agent, or Firm*—Sughrue Mion, PLLC

(57) ABSTRACT

A surface light-source device is composed of a light guide plate, luminescent panels and reflector sheets. The light guide plate is composed of three light guide units respectively formed in a rectangular plate-like shape having a rectangular light emission surface, a thick portion, a thin side portion, an incline rear portion and a parallel groove. The luminescent panel includes two element lines formed by aligning LEDs. The parallel groove is formed so as to be symmetrical about a center line, which is perpendicular to the light emission surface, and so as to dwindle its width toward the light emission surface. The light emitted from the LED toward an overhead portion and having the highest brightness is diffused by a groove surface of the parallel groove and is taken into the light guide unit. Thus, brightness unevenness is reduced at the light emission surface.

14 Claims, 5 Drawing Sheets

SURFACE LIGHT-SOURCE DEVICE USING LIGHT-EMITTING ELEMENTS

FIELD OF THE INVENTION

The present invention relates to a surface light-source device using light-emitting elements of LEDs and so forth.

BACKGROUND OF THE INVENTION

A surface light-source device is used as a backlight unit of a liquid-crystal display, an indication light for advertisement and sign, and so forth. For instance, in Japanese Patent Laid-Open Publication No. 2005-234397, a rod-like light source of a fluorescent lamp or the like is used and light emitted from the circumference of the rod-like light source is guided by a light guide plate so as to uniformly emit the light from a light emission surface of the light guide plate.

When the fluorescent lamp is used such as described in the above-noted Publication, the surface light-source device has a limitation to reduction of thickness due to a diameter of the fluorescent lamp. In this regard, it is considered that a light-emitting element of an LED and so forth is disposed instead of the fluorescent lamp. However, although the light from the LED generally has emission distribution resembling $\cos\theta$ to the Nth power, an emission amount is large in an upward direction. Consequently, an amount of the light emitted from the light emission surface of the light guide plate becomes large at an overhead portion of the LED. Thus, there arises a problem in that emission unevenness of the light emission surface of the light guide plate is conspicuous in comparison with the case using the fluorescent lamp.

SUMMARY OF THE INVENTION

In view of the foregoing, it is a primary object of the present invention to provide a surface light-source device in which thickness is reduced and electric power consumption is lowered.

It is a second object of the present invention to provide a surface light-source device which is available for a large display size as well.

In order to achieve the above and other objects, the surface light-source device according to the present invention comprises at least one luminescent panel and at least one light guide unit. The luminescent panel includes a plurality of light-emitting element lines formed by aligning light-emitting elements. The light guide unit guides the light of the luminescent panel toward the outside. The light guide unit includes a rectangular light emission surface, a thick portion, thin side portions, an incline rear portion and a parallel groove. The light emission surface emits the light to the outside. The thick portion is formed from a central area of the light emission surface toward an opposite surface of the light emission surface. The thick portion is parallel to one edge of the light emission surface. The thin side portions are disposed at the one edge and the other edge opposite to the one edge. The thin side portion is formed more thinly than the thick portion. The incline rear portion is formed between the thick portion and the thin side portion. The incline rear portion becomes thinner from the thick portion toward the thin side portion. The parallel groove is formed in the thick portion so as to be parallel to the one edge of the light emission surface. The parallel groove has a section taken in a direction perpendicular to the one edge and formed in a shape, which is symmetrical about a center line perpendicular to the light emission surface and a width of which dwindles toward the light emission surface. The light-emitting element lines are disposed inside the parallel groove at symmetrical positions relative to the center line so as to be parallel to the one edge.

It is preferable that the light-emitting element is an LED and the element lines are disposed in a state that the LEDs are arranged in a zigzag formation. Further, it is preferable that a plurality of the light guide units and the luminescent panels are provided and one end of the light guide unit is joined to the other end of another light guide unit.

According to the surface light-source device of the present invention, the light emitted to an overhead portion of the LED and having the highest light amount is diffused by a groove surface of the parallel groove and is taken into the light guide unit. The light to the overhead portion becomes weak. Thus, emission unevenness is reduced at the light emission surface of the light guide unit so that substantially uniform light is emitted from the light emission surface. Meanwhile, since the LED is used as the light-emitting element and the element lines are disposed so as to arrange the LEDs in the zigzag formation, the LEDs are uniformly distributed on the luminescent panel so that the emission unevenness is further restrained.

DESCRIPTION OF THE PREFERRED EMBODIMENTS

Figure 1:
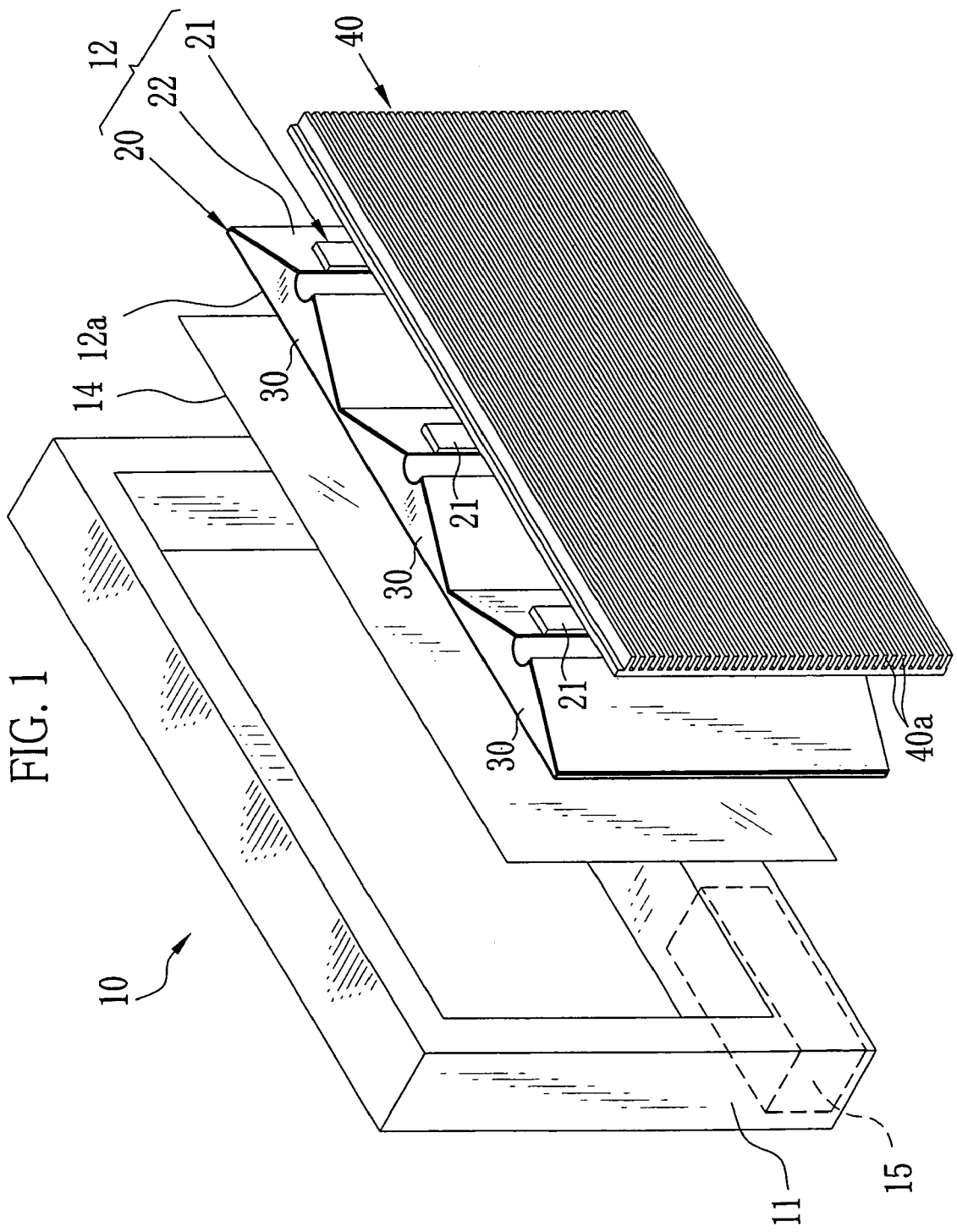
FIG. 1 is an exploded perspective view showing a structure of a display.

As shown in FIG. 1, a display 10 comprises an outer frame 11, a surface light-source device 12 contained in the outer frame 11, a translucent sheet 14 attached to a light emission surface 12a of the surface light-source device 12, and a drive unit 15 including an inverter power source and a control circuit. The drive unit 15 is disposed in the outer frame 11. As to the display 10, characters and marks drawn on the sheet 14 are illuminated by the surface light-source device 12 so that information is adapted to be viewed. For instance, the display 10 is used for an advertising light, a marker light, an evacuation light and so forth set up in places of offices, shops, roads, transportation and so forth.

Figure 2:
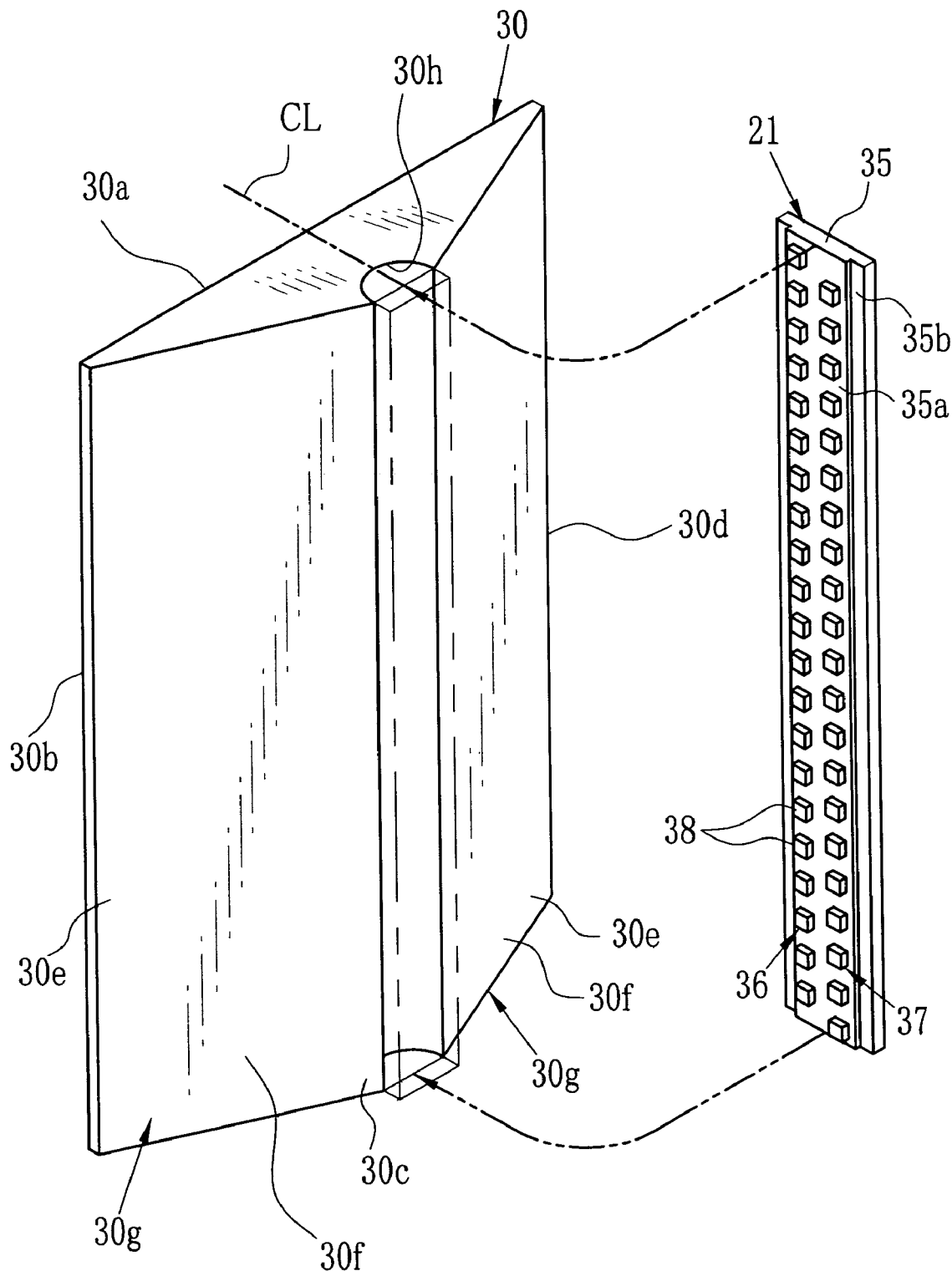
FIG. 2 is a perspective view showing a structure of a part of a surface light-source device.
Figure 3:
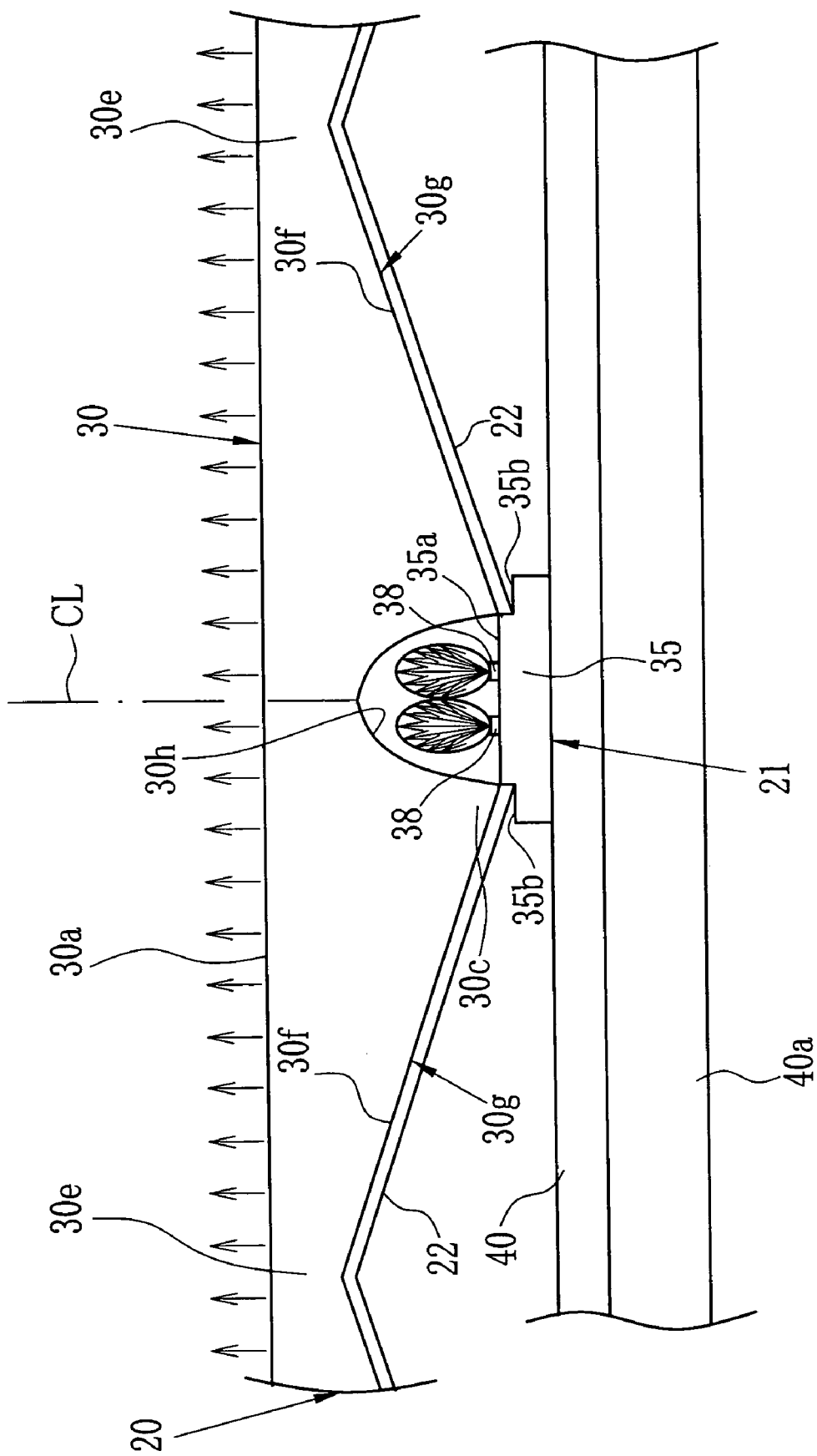
FIG. 3 is a plan view showing a light emission state of a light guide unit.

As shown in FIGS. 1 to 3, the surface light-source device 12 is composed of a light guide plate 20, a luminescent panel 21 and a reflector sheet 22.

The light guide plate 20 is formed from an extruded molding made of PMMA (polymethylmethacrylate), for example. The light guide plate 20 is composed of three light guide units 30 integrally aligned. Incidentally, the number of the light guide units 30 may be properly changed in accordance with a display size of the display 10. For instance, when the display size is large, the light guide units 30 are disposed in matrix of n×m. Instead of the matrix arrangement, the light guide units 30 may be aligned such as shown in FIG. 1 and a width thereof may be changed in a direction perpendicular to the arrangement direction so as to coincide with the display size. Meanwhile, when the display size is small, the light guide plate 20 may be composed of the sole light guide unit 30.

As shown in FIG. 2, the light guide unit 30 is formed in a plate-like shape having a rectangular light emission surface 30a. The light guide unit 30 further has a thick portion 30c, thin side portions 30e, incline rear portions 30g and a parallel groove 30h. The thick portion 30c is formed at a central portion of a surface, which is opposite to the light emission surface 30a, so as to be parallel to one edge 30b of the light emission surface 30a. The thin side portions 30e are disposed near the edge 30b and an opposite edge 30d thereof. The thin side portion 30e is formed so as to be thinner than the thick portion 30c. The incline rear portion 30g has an incline rear surface 30f and gradually becomes thinner from the thick portion 30c toward the thin side portion 30e. The parallel groove 30h is formed in the thick portion 30c so as to be parallel to the edge 30b and so as to confront the light emission surface 30a. With respect to a section of the parallel groove 30h, the section extending in a direction perpendicular to the edge 30b is symmetrical about a center line CL, which is perpendicular to the light emission surface 30a, and this section hollows toward the light emission surface 30a.

The incline rear portion 30g reflects the light of the luminescent panel 21, which has entered the light guide unit 30 through a surface forming the parallel groove 30h, by the incline rear surface 30f toward the light emission surface 30a. The incline rear surface 30f is designed so as to uniformly apply the reflected light to the entire light emission surface 30a for the purpose of reducing emission unevenness of planar light to be emitted from the light emission surface 30a. The light emission surface 30a is formed as a flat surface or a curved surface.

The parallel groove 30h is sufficient to have a groove shape in that a width thereof dwindles toward the top. For example, the groove to be preferably used has a section of a triangle shape, a hyperbolic shape, an elliptical shape, a semicircular shape, catenary shape and so forth. The luminescent panel 21 is attached to the parallel groove 30h by means of a heat-resistant silicone adhesive, an attachment screw and so forth. The parallel groove 30h is designed so as to prevent the light of the luminescent panel 21 from being reflected by the groove surface and returning to the luminescent panel 21.

As shown in FIG. 2, the luminescent panel 21 is composed of a base 35 and two element lines 36 and 37 of light-emitting elements aligned on the base 35. Incidentally, the base 35 also works as a reflector. For this purpose, a reflective surface 35a is formed by aluminum evaporation and so forth on an area excepting a print pattern used for connecting LEDs 38. The element lines 36 and 37 are composed of a large number of the white light-emitting diodes (LEDs) 38 arranged in line. In this regard, the LEDs 38 of the element lines 36 and 37 are arranged in a zigzag formation. An arrangement pitch and a number of the LEDs 38 are properly determined on the basis of a necessary light amount, luminance of the LED 38, and so forte. As shown in FIG. 3, the luminescent panel 21 is attached to the parallel groove 30h such that the element lines 36 and 37 are symmetrically disposed relative to the center line CL of the parallel groove 30h.

A rear surface of the base 35 is integrally provided with a radiator plate 40 made of aluminum. By virtue of the radiator plate 40, heat of the LED 38 is radiated to the outside. The back of the radiator plate 40 is provided with many fins 40a. The luminescent panel 21 is electrically connected to the drive unit 15 by which operations of lighting, extinction and so forth are controlled.

The incline rear portion 30g of the light guide unit 30 is provided with the reflector sheet 22 tightly attached thereto. Alternatively, the reflector sheet 22 may be separately disposed from the incline rear portion 30g. The reflector sheet 22 reflects and returns the light, which leaks through the incline rear portion 30g of the light guide unit 30, into the light guide unit 30. It is sufficient that the reflector sheet 22 merely reflects the light. For example, the reflector sheet to be preferably used is a resin sheet of polyethylene terephthalate (PET), polypropylene (PP) and so forth, the resin sheet on which a mirror surface is formed by aluminum evaporation and so forth, a metal foil of aluminum and so forth, a resin sheet carrying the metal foil, and a thin metal plate. Steps 35b are formed at both sides of the base 35. The step 35 retains an edge of the reflector sheet 22 to tightly attach the reflector sheet 22 to the incline rear surface 30f.

Next, an operation of the above embodiment is described below. Upon turning on the respective LEDs 38 of the luminescent panel 21 by the drive unit 15, the light of the LED 38 enters the light guide unit 30 through the groove surface of the parallel groove 30h. The light having entered the light guide unit 30 is reflected by the incline rear surface 30f and the reflector sheet 22, and is emitted from the light emission surface 30a as the planar light to uniformly illuminate the entire rear surface of the sheet 14. In virtue of this, the characters and the marks drawn on the sheet 14 are displayed.

As shown in FIG. 2, the luminescent panel 21 is attached to the parallel groove 30h such that the element lines 36 and 37 are symmetrically disposed relative to the center line CL of the parallel groove 30h. Thus, the LEDs 38 of the respective element lines 36 and 37 are separately disposed from the center line CL. Consequently, an overhead portion of the LED 38 having the highest light amount is diffused at an area of the parallel groove 30h having a large curvature, and is taken into the light guide unit 30. Since the light emitted to the overhead portion becomes weak, luminance unevenness is reduced at the light emission surface near to the parallel groove 30h and the substantially uniform light is emitted from the light emission surface 30a. Thus, the emission unevenness is restrained. It is unnecessary to improve light diffusion properties by performing a roughening process for the parallel groove 30h and the light emission surface 30a for the purpose of restraining the emission unevenness such as conventional ways. In virtue of this, manufacture becomes easy. By the way, when it is desired to further restrain the emission unevenness, the roughening process of sanded surface or the like may be performed as need arises.

Since the luminescent panel 21 employs the LED 38 as the light source, luminous efficiency is improved and electric power consumption is lowered. Moreover, durability is improved. Further, since a thickness of the luminescent panel is thinner than a conventional fluorescent lamp, it is possible to reduce a thickness of the entire surface light-source device.

Figure 4:
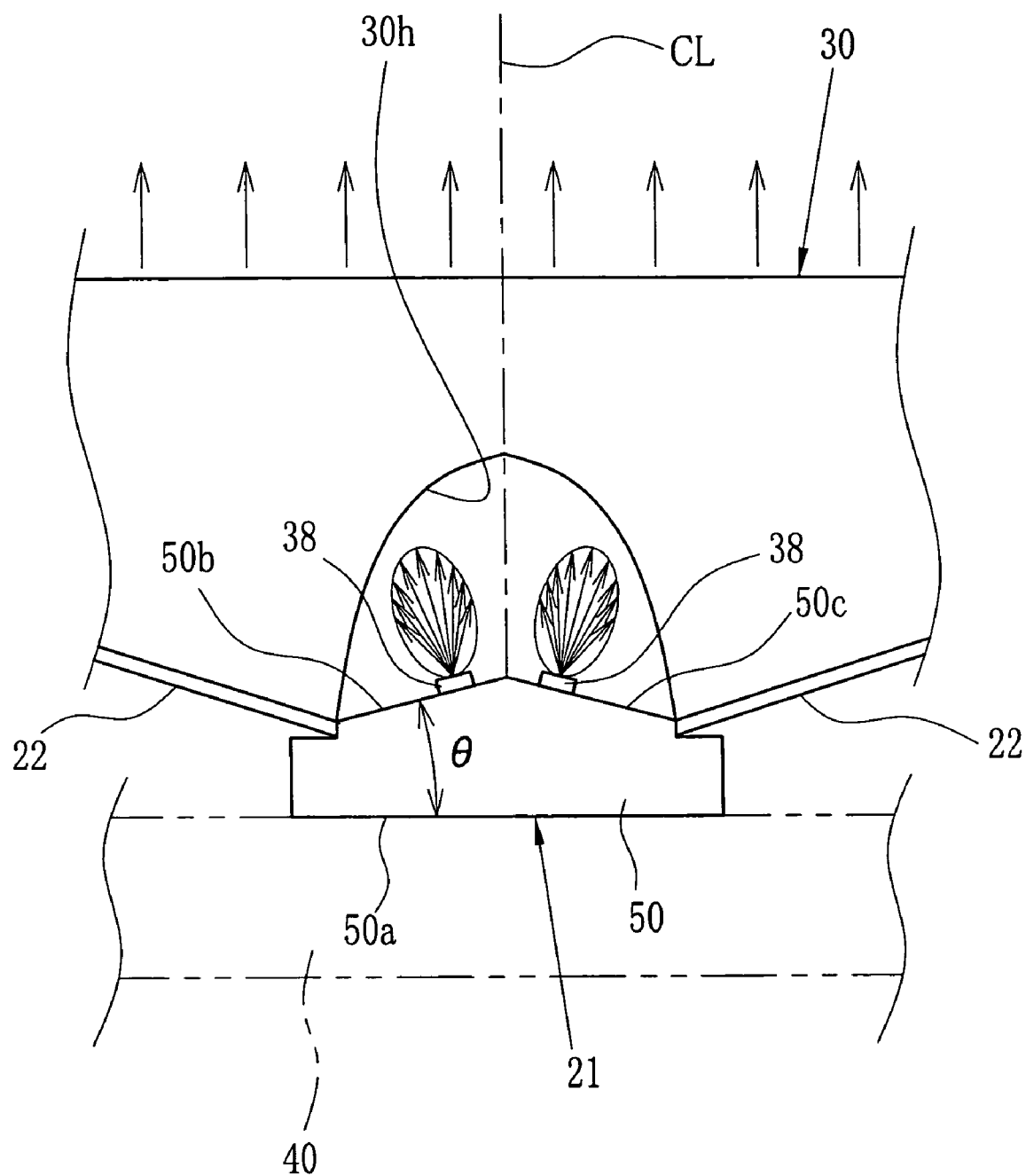
FIG. 4 is an enlarged plan view showing a luminescent panel of another embodiment.

In the above embodiment, the LEDs 38 are arranged on the flat base. However, as shown in FIG. 4, the LEDs 38 may be arranged on a base 50 having mountain-like base surfaces 50b and 50c, which incline by an angle θ relative to a bottom surface 50a. In this case, by changing the incline angle θ of the base surfaces 50b and 50c in accordance with the shape of the parallel groove 30h, it is possible to further restrain the brightness unevenness of the surface light-source device. In this embodiment, a component identical with that shown in FIGS. 1 to 3 is denoted by the same reference numeral.

In the foregoing embodiment, the reflective surface 35a is formed on the LED attachment surface excepting the print pattern. However, the print pattern may be formed on an opposite side of the attachment surface of the LEDs 38. In this case, the entire attachment surface of the LEDs 38 may be the emission surface. Incidentally, a reflector may be individually provided instead of forming the reflective surface 35a on the base 35.

Figure 5:
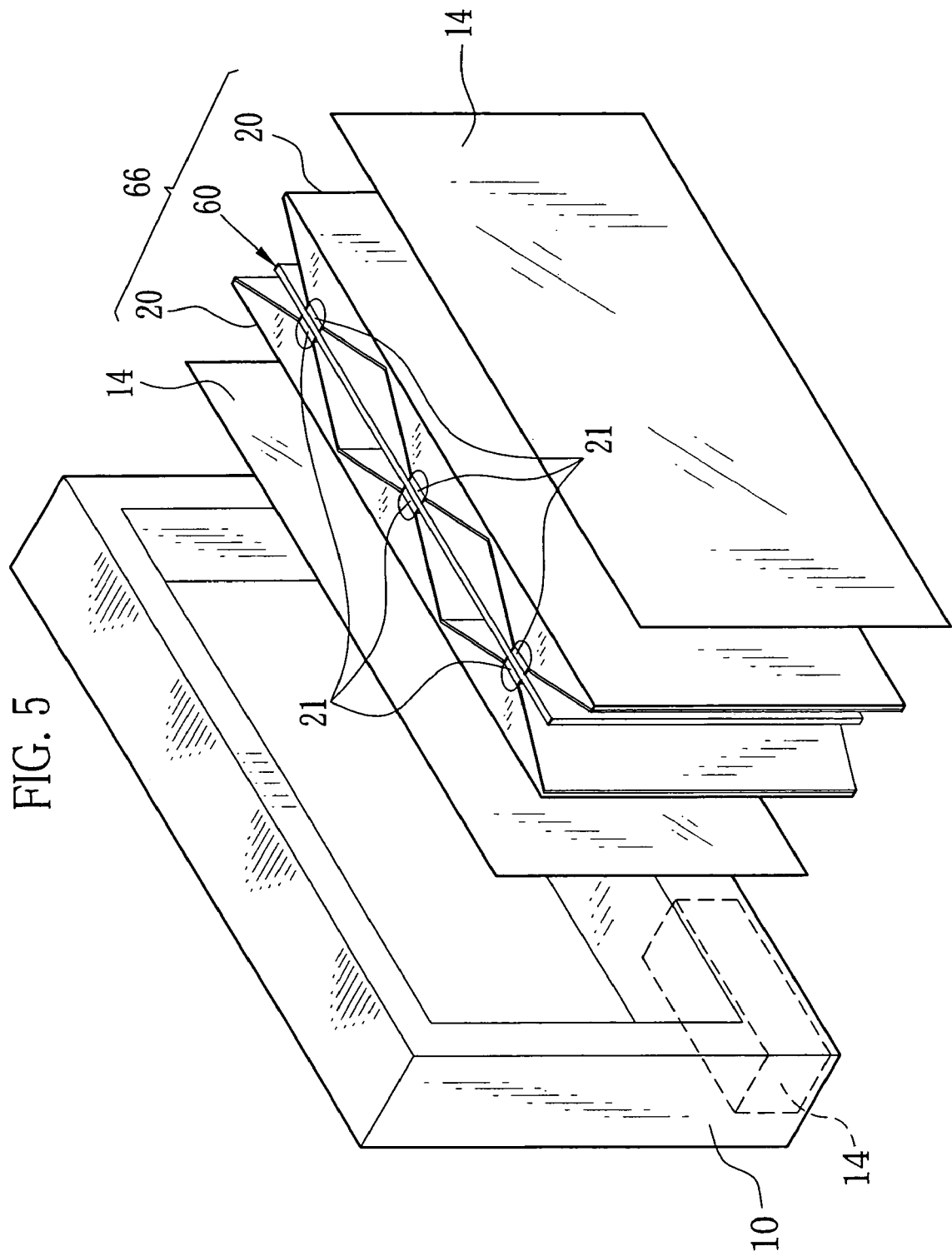
FIG. 5 is an exploded perspective view showing a double-sided surface light-source device of the other embodiment.

In the foregoing embodiment, the surface light-source device 12 emits the light from the sole side. However, as shown in FIG. 5, the luminescent panels 21 may be disposed at both sides of a radiator plate 60 to compose a surface light-source device 66 in which the light guide plates 20 are disposed at both the sides in accordance with the luminescent panels 21 to emit the light from both the sides. Instead of attaching the luminescent panels 21 to both sides of the radiator plate 60, two lines of the light-emitting elements may be formed on both sides of a base to compose a luminescent panel. In this case, radiator plates are attached to both lateral ends of the luminescent panel.

The element lines 36 and 37 for forming the luminescent panel 21 are not limited to two lines but may be four or more lines. Although the white LED is used as the LED 38, LEDs of three colors of red, green and blue may be alternately arranged to emit the white light. The light to be emitted is not limited to white but may be other color. Further, the light-emitting element is not limited to the LED 38.

As to the material of the light guide plate, it is possible to use PC (polycarbonate), PET (polyethylene terephthalate), PP (polypropylene), benzyl methacrylate, MS (methacrylstyrene), COP (cyclo-olefin polymer) and so forth, besides the PMMA used in the foregoing embodiment. The light guide may be formed by an injection molding method, a casting polymerization method and so forth. As need arises, fine particles for scattering the light may be mixed in the light guide plate.

In the foregoing embodiment, the reflector sheet 22 has the similar shape with the incline rear surface 30f. However, the reflector sheet 22 may have another shape different from the incline rear surface 30f. For example, the reflector sheet 22 may have a cylindrical shape and a semi-elliptical section, and may be separated from the incline rear surface 30f without being attached thereto.

In the foregoing embodiments, the surface light-source devices 12 and 66 are loaded into the display 10 used for the advertising light, the marker light, the evacuation light and so forth. The present invention, however, is not limited to the above embodiments and may be adopted to a backlight unit of a liquid-crystal display, for example. Moreover, the surface light-source device itself may be utilized as a mere illuminating device.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A surface light-source device comprising:
   (A) at least one luminescent panel including a plurality of light-emitting element lines formed by aligning light-emitting elements in each line;
   (B) at least one light guide unit for guiding light of said luminescent panel toward the outside, said light guide unit including:
   a rectangular light emission surface for emitting the light to the outside;
   a thick portion formed from a central area of said light emission surface toward an opposite surface of said light emission surface, said thick portion being parallel to one edge of said light emission surface;
   thin side portions disposed at said one edge and the other edge opposite to said one edge, each of said thin side portions being formed more thinly than said thick portion;
   an incline rear portion formed between said thick portion and said thin side portions, said incline rear portion becoming thinner from said thick portion toward said thin side portions; and
   a parallel groove formed in said thick portion so as to be parallel to said one edge, said parallel groove having a section taken in a direction perpendicular to said one edge and formed in a shape, which is symmetrical about a center line perpendicular to said light emission surface and a width of which dwindles toward said light emission surface, and at least two of said light-emitting element lines being disposed inside said parallel groove at symmetrical positions relative to said center line so as to be parallel to said one edge.

2. The surface light-source device according to claim 1, wherein said light-emitting element is an LED and the respective light-emitting element lines are arranged such that the LEDs of said luminescent panel are disposed in a zigzag formation within said parallel groove.

3. The surface light-source device according to claim 2, wherein said LED is a white LED.

4. The surface light-source device according to claim 1, further comprising:
   a reflector sheet disposed at said incline rear portion of said light guide unit, said reflector sheet reflecting and returning the light, which leaks through said incline rear portion, into said light guide unit.

5. The surface light-source device according to claim 1, wherein said luminescent panel further includes:
   a base having a base surface on which said light-emitting elements are arranged, said base being attached to said parallel groove.

6. The surface light-source device according to claim 5, wherein said base surface is flat.

7. The surface light-source device according to claim 5, wherein said base surface slopes in accordance with the shape of said parallel groove.

8. The surface light-source device according to claim 7, wherein said base has a base cross section taken in the direction perpendicular to said one edge and formed in a base shape, which is symmetrical about the center line perpendicular to said light emission surface and a base width of which dwindles toward said light emission surface.

9. The surface light-source device according to claim 8, wherein said base surface of said base includes two inclined surfaces each facing substantially toward said thin side portions and away from the center line.

10. The surface light-source device according to claim 5, wherein a reflective surface is formed on said base so that said base also works as a reflector.

11. The surface light-source device according to claim 10, wherein said reflective surface is formed by aluminum evaporation on an area excepting a print pattern used for connecting said light-emitting elements.

12. The surface light-source device according to claim 1, wherein said luminescent panel and said light guide unit compose a light guide assembly, and said surface light-source device comprises a plurality of said light guide assemblies.

13. The surface light-source device according to claim 12, wherein said light guide assemblies are joined so as to connect the edges of said light emission surfaces.

14. The surface light-source device according to claim 12, wherein said light guide assemblies are joined back to back so as to make said light emission surfaces face in opposite directions so that the light is emitted from both sides of said surface light-source device.

* * * * *